United States Patent
Zou et al.

(10) Patent No.: US 12,298,492 B2
(45) Date of Patent: May 13, 2025

(54) BATCH FABRICATION OF MEMS SCANNING MIRROR

(71) Applicant: THE TEXAS A&M UNIVERSITY SYSTEM, College Station, TX (US)

(72) Inventors: Jun Zou, College Station, TX (US); Song Xu, College Station, TX (US)

(73) Assignee: THE TEXAS A&M UNIVERSITY SYSTEM, College Station, TX (US)

( * ) Notice: Subject to any disclaimer, the term of this patent is extended or adjusted under 35 U.S.C. 154(b) by 756 days.

(21) Appl. No.: 17/438,601

(22) PCT Filed: Mar. 19, 2020

(86) PCT No.: PCT/US2020/023491
§ 371 (c)(1),
(2) Date: Sep. 13, 2021

(87) PCT Pub. No.: WO2020/197910
PCT Pub. Date: Oct. 1, 2020

(65) Prior Publication Data
US 2022/0137397 A1   May 5, 2022

Related U.S. Application Data

(60) Provisional application No. 62/823,495, filed on Mar. 25, 2019.

(51) Int. Cl.
*G02B 26/08* (2006.01)
*B81B 3/00* (2006.01)
*G02B 26/10* (2006.01)

(52) U.S. Cl.
CPC ........ *G02B 26/0833* (2013.01); *B81B 3/0018* (2013.01); *G02B 26/085* (2013.01);
(Continued)

(58) Field of Classification Search
CPC .......................... G02B 26/0833; G02B 26/08; G02B 26/0816; G02B 26/0841–0866;
(Continued)

(56) References Cited

U.S. PATENT DOCUMENTS 5,872,880 A * 2/1999 Maynard ............. G02B 6/4226
385/83
7,459,093 B1   12/2008 Fu
(Continued)

OTHER PUBLICATIONS

PCT/US2020/023491 International Search Report and Written Opinion dated Jun. 12, 2020 (19 p.).
(Continued)

*Primary Examiner* — Stephone B Allen
*Assistant Examiner* — Adam W Booher
(74) *Attorney, Agent, or Firm* — CONLEY ROSE, P.C.

(57) ABSTRACT

Methods are disclosed for manufacturing a Micro-Electro-Mechanical Systems (MEMS) scanning mirror. In an embodiment, one method includes depositing a hinge material on a substrate and removing first and second portions of the substrate to form an outer frame, an inner frame, and a mirror plate in the substrate. First and second portions of the hinge material rotationally couple the outer frame to the inner frame and the inner frame to the mirror plate for rotation about first and second orthogonal axes of rotation. In another embodiment, a third portion of the substrate rotationally couples the inner frame to the mirror plate. In still another embodiment, an elastomer material is configured as a bending hinge that rotationally couples the outer frame to the inner frame.

18 Claims, 7 Drawing Sheets

(52) U.S. Cl.
CPC ..... *B81B 2201/042* (2013.01); *B81B 2203/01* (2013.01); *B81B 2203/0154* (2013.01); *G02B 26/105* (2013.01)

(58) Field of Classification Search
CPC .... G02B 26/10; G02B 26/101; G02B 26/105; G02B 7/182; G02B 7/1821; B81B 3/0018; B81B 2201/042; B81B 2201/045; B81B 2203/01; B81B 2203/0154; B81B 2203/058; B81B 2203/0109; B81C 1/00142
See application file for complete search history.

(56) References Cited

U.S. PATENT DOCUMENTS

| | | | |
|---|---|---|---|
| 8,208,192 B2 | 6/2012 | Keyworth et al. | |
| 8,429,809 B2 | 4/2013 | Orcutt | |
| 2004/0160687 A1* | 8/2004 | Van Drieenhuizen | G02B 26/0841 359/872 |
| 2009/0047527 A1 | 2/2009 | Yang et al. | |
| 2012/0002259 A1* | 1/2012 | Plesko | G02B 26/105 359/200.7 |

OTHER PUBLICATIONS

Huang, Chih-Hsien et al., "A Water-Immersible 2 Axis Scanning Mirror Microsystem for Ultrasound Andha Photoacoustic Microscopic Imaging Applications," Microsystem Technologies, vol. 19, pp. 577-582, 2013 (6 p.).

Yao, Junjie et al., "High-Speed Label-Free Functional Photoacoutstic Microscopyof Mouse Brain in Action," Nature Methods, vol. 12, No. 5, May 2015, pp. 407-413 (7 p.).

Li, Lin et al., "Handheld Optical-Resolution Photoacoustic Microscopy," Journal of Biomedical Optics, vol. 22, No. 4, P. 041002, Apr. 2017 (6 p.).

Xu, Song et al., "A Micromachined Water-Immersible Scanning Mirror using BoPET Hinges," Sensors and Actuators A: Physical, vol. 298, Oct. 15, 2019, p. 111564 (5 p.).

Xu, Song et al., "Miniaturization and Batch Fabrication of Two-Axis Water-Immersible Scanning Mirrors," SPIE 10931, MOEMS and Miniaturized Systems XVIII, 109310M, Mar. 4, 2019 (14 p.).

* cited by examiner

BATCH FABRICATION OF MEMS SCANNING MIRROR

CROSS-REFERENCE TO RELATED APPLICATIONS

This application is a 35 U.S.C. § 371 national stage application of PCT/US2020/023491 filed Mar. 19, 2020 and entitled "Batch Fabrication of MEMS Scanning Mirror," which claims benefit of U.S. provisional patent application Ser. No. 62/823,495 filed Mar. 25, 2019, and entitled "Batch Fabrication of MEMS Scanning Mirror Using PET Hinges," each of which is hereby incorporated herein by reference in its entirety for all purposes.

STATEMENT REGARDING FEDERALLY SPONSORED RESEARCH OR DEVELOPMENT

This invention was made with government support under IDBR 1255921 awarded by National Science Foundation. The government has certain rights in the invention.

BACKGROUND

Micro-ElectroMechanical Systems (MEMS) scanning mirrors are used in many applications. Such MEMS devices are often fabricated using silicon as the hinge material, however such MEMS devices may be susceptible to damage from shock or impacts. Applications in which shock and impacts may occur are use under water for optical and acoustic imaging applications. Other applications are on vibrating platforms such as handheld, wearable, and endoscopic imaging systems for biomedicine or in scanning imaging radar or Light Detection and Ranging (LIDAR) systems for autonomous vehicles and robots.

BRIEF SUMMARY OF THE DISCLOSURE

Some embodiments disclosed herein as directed to a method for manufacturing a Micro-ElectroMechanical Systems (MEMS) scanning mirror. In an embodiment, the method includes depositing a hinge material on a first side of a substrate. Further, the method includes removing a first portion of the substrate from a second side of the substrate to form an outer frame in the substrate and removing a second portion of the substrate from the second side of the substrate to form an inner frame and a mirror plate in the substrate. A first portion of the hinge material rotationally couples the outer frame to the inner frame for rotation about a first axis of rotation and a second portion of the hinge material rotationally couples the inner frame to the mirror plate for rotation about a second axis of rotation. The first axis of rotation is orthogonal to the second axis of rotation.

Other embodiments disclosed herein are directed to another method for manufacturing a Micro-ElectroMechanical Systems (MEMS) scanning mirror. In an embodiment, the method includes depositing a hinge material on a first side of a substrate. Further, the method includes removing a first portion of the substrate from a second side of the substrate to form an outer frame in the substrate and removing a second portion of the substrate from the second side of the substrate to form an inner frame and a mirror plate in the substrate. A portion of the hinge material rotationally couples the outer frame to the inner frame for rotation about a first axis of rotation and a third portion of the substrate rotationally couples the inner frame to the mirror plate for rotation about a second axis of rotation. The first axis of rotation is orthogonal to the second axis of rotation.

Still other embodiments disclosed herein are directed to another method for manufacturing a Micro-ElectroMechanical Systems (MEMS) scanning mirror. In an embodiment, the method includes depositing a hinge material on a first side of a substrate, the hinge material covering less than all of the first side of the substrate, and depositing an elastomer material separate from the hinge material on the first side of the substrate. Further, the method includes removing a first portion of the substrate from a second side of the substrate to form an outer frame in the substrate and removing a second portion of the substrate from the second side of the substrate to form an inner frame and a mirror plate in the substrate. A portion of the elastomer material is configured as a bending hinge that rotationally couples the outer frame to the inner frame for rotation about a first axis of rotation and a portion of the hinge material is configured as a torsional hinge that rotationally couples the inner frame to the mirror plate for rotation about a second axis of rotation. The first axis of rotation orthogonal to the second axis of rotation.

Embodiments described herein comprise a combination of features and advantages intended to address various shortcomings associated with certain prior devices, systems, and methods. The foregoing has outlined rather broadly the steps, features, and technical advantages of the disclosed method for batch fabrication of MEMS scanning mirrors in order that the detailed description that follows may be better understood. The various characteristics described above, as well as other features, will be readily apparent to those skilled in the art upon reading the following detailed description, and by referring to the accompanying drawings. It should be appreciated by those skilled in the art that the conception and the specific embodiments disclosed may be readily utilized as a basis for modifying or designing other structures for carrying out the same purposes of the disclosure. It should also be realized by those skilled in the art that such equivalent constructions do not depart from the spirit and scope of the disclosure or the appended claims.

BRIEF DESCRIPTION OF THE DRAWINGS

For a detailed description of the preferred embodiments of the disclosure, reference will now be made to the accompanying drawings in which.

DETAILED DESCRIPTION OF THE PREFERRED EMBODIMENTS

Figure 1:
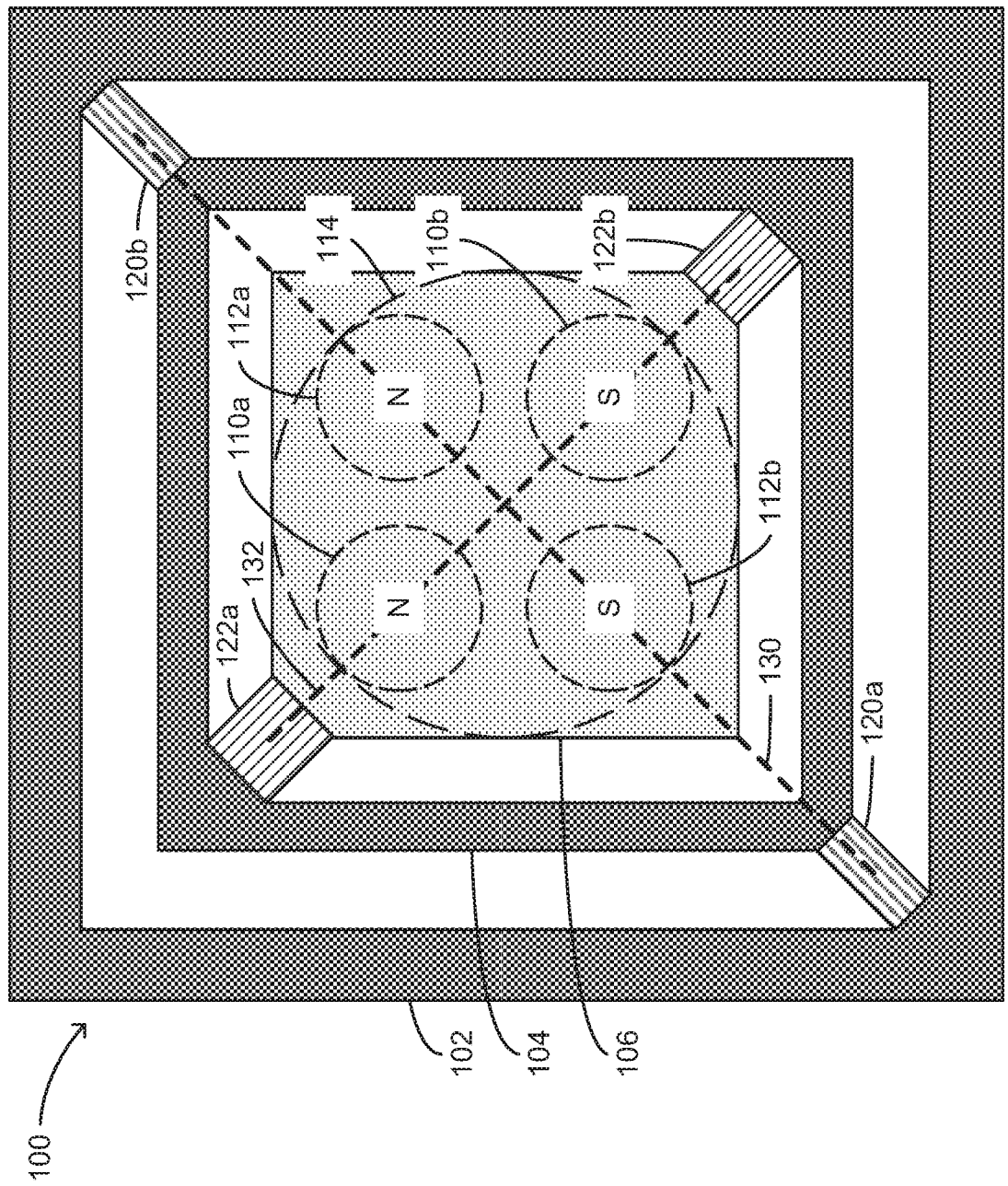
FIG. 1 is a plan view of a first MEMS scanning mirror according to various embodiments of the present disclosure.

The following discussion is directed to various exemplary embodiments. However, one skilled in the art will understand that the examples disclosed herein have broad application, and that the discussion of any embodiment is meant only to be exemplary of that embodiment, and not intended to suggest that the scope of the disclosure, including the claims, is limited to that embodiment.

Certain terms are used throughout the following description and claims to refer to particular features or components. As one skilled in the art will appreciate, different persons may refer to the same feature or component by different names. This document does not intend to distinguish between components or features that differ in name but not function. The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection of the two devices, or through an indirect connection that is established via other devices, components, nodes, and connections.

Methods according to the present disclosure provide fabrication of MEMS scanning mirrors using conventional microfabrication techniques, rather than techniques such as laser cutting and mechanical dicing followed by multiple steps of manual assembly, which provide lower spatial resolution and alignment accuracy and impede further miniaturization and batch fabrication of MEMS scanning mirrors. MEMS devices fabricated using methods according to the present disclosure may be made smaller than MEMS devices made using prior fabrication techniques.

MEMS devices fabricated using methods according to the present disclosure may include hinges made from materials including biaxially-oriented polyethylene terephthalate (BoPET) and elastomers, as well as from silicon. MEMS devices that include hinges made from BoPET and/or elastomers have higher resistance to impact or shock damage than conventional MEMS scanning mirrors using silicon as the hinge material and, therefore, may be used in a wider variety of applications.

FIG. 1 is a plan view of a first MEMS scanning mirror 100 according to various embodiments of the present disclosure. The scanning mirror 100 includes an outer frame 102, an inner frame 104, and a mirror 106. The inner frame 104 is rotationally coupled to the outer frame 102 by torsional hinges 120a and 120b, which permit rotational motion of the inner frame 104 relative to the outer frame 102 along an axis of rotation 130. The hinges 120a and 120b are referred to herein as "slow-axis hinges" for reasons explained below. The mirror 106 is rotationally coupled to the inner frame 104 by torsional hinges 122a and 122b, which permit rotational motion of the mirror 106 relative to the inner frame 104 along an axis of rotation 132. The hinges 122a and 122b are referred to herein as "fast-axis hinges."

The fast-axis hinges 122a and 122b are made wider and shorter than the slow-axis hinges 120a and 120b to provide a higher resonance frequency in the former than in the latter, thus the nomenclature "fast-axis" and "slow-axis."

Magnets 110a, 110b, 112a, and 112b are permanent magnets mounted to a bottom side of the mirror 106 opposite the top side of the mirror 106 that is visible in FIG. 1. Magnets 110a and 110b are mounted symmetrically about the axis of rotation 130 on the axis of rotation 132 and are oriented with opposing magnetic polarity to each other. Similarly, magnets 112a and 112b are mounted symmetrically about the axis of rotation 132 on the axis of rotation 130 and are oriented with opposing magnetic polarity to each other.

An inductor 114 mounted below the bottom side of the mirror 106 and is oriented with a center of its magnetic field coaxial with a center point of the magnets 110a, 110b, 112a, and 112b, and with the intersection of the axes of rotation 130 and 132. The inductor 114 is driven with an Alternating Current (AC) driving current that includes higher and lower frequency components, producing an oscillating magnetic field having corresponding higher and lower frequency components. The higher frequency component is close to the resonance of the fast-axis hinges 122a and 122b and causes the mirror 106 to oscillate about the axis of rotation 132 relative to the inner frame 104 at a higher frequency in a fast scanning direction. The lower frequency component is close to the resonance of the slow-axis hinges 120a and 120b and causes the inner frame 104 (and mirror 106) to oscillate about the axis of rotation 130 relative to the outer frame 102 at a lower frequency in a slow scanning direction.

It will be understood that the resonance frequencies of the fast-axis hinges and the slow-axis hinges will differ depending upon whether the hinges are operating in air or in water. Further, the resonance frequencies of the fast-axis hinges and the slow-axis hinges will be determined by the physical characteristics of the hinges: for example, by the material of the hinge, and its length, width, and thickness. Hinges may comprise solely polyethylene terephthalate (PET), PET combined with other materials, or may comprise silicon, elastomer, or other suitable material to obtain a desired resonance frequency of the hinge.

In some embodiments, the fast-axis hinges 122a and 122b are designed to have a resonance frequency at least twice the resonance frequency of the slow-axis hinges 120a and 120b. Such a ratio between resonance frequencies provides a dynamic filtering effect, reducing an effect the lower frequency component of the oscillating magnetic field from the inductor 114 has on the fast-axis hinges 122a and 122b, and vice versa for an effect of the higher frequency component of the oscillating magnetic field on the slow-axis hinges 120a and 120b. However, ratios between resonance frequencies that are greater than or less than 2:1 may be used in other MEMS scanning mirrors according to the disclosure.

In other embodiments, multiple inductors are used, the number of inductors corresponding to the number of magnets. In such embodiments, each inductor and its associated magnet form a driving pair. The inductor of each driving pair is powered with an AC current having a single frequency. The physical separation of the inductors and magnets into driving pairs reduces the effect that the magnetic field from one inductor has on the magnet of another driving pair. Thus, the driving pairs can be independently controlled without interfering with each other. Two driving pairs cause the mirror 106 to oscillate about the axis of rotation 132 relative to the inner frame 104, and the other driving pair (or pairs) causes the inner frame 104 (and mirror 106) to oscillate about the axis of rotation 130 relative to the outer frame 102. Such embodiments, while fabricated using the methods of the present disclosure, do not require ratios between resonance frequencies of the fast-axis and slow-axis hinges of 2:1 to obtain dynamic filtering.

The application in which a MEMS scanning mirror according to the disclosure is used may determine a desired scanning frequency in each of the fast and slow scanning directions. Further, a material used in fabricating the fast-axis hinges 122a and 122b and the slow-axis hinges 120a and 120b may determine a maximum and/or minimum scanning frequency.

Figure 2:
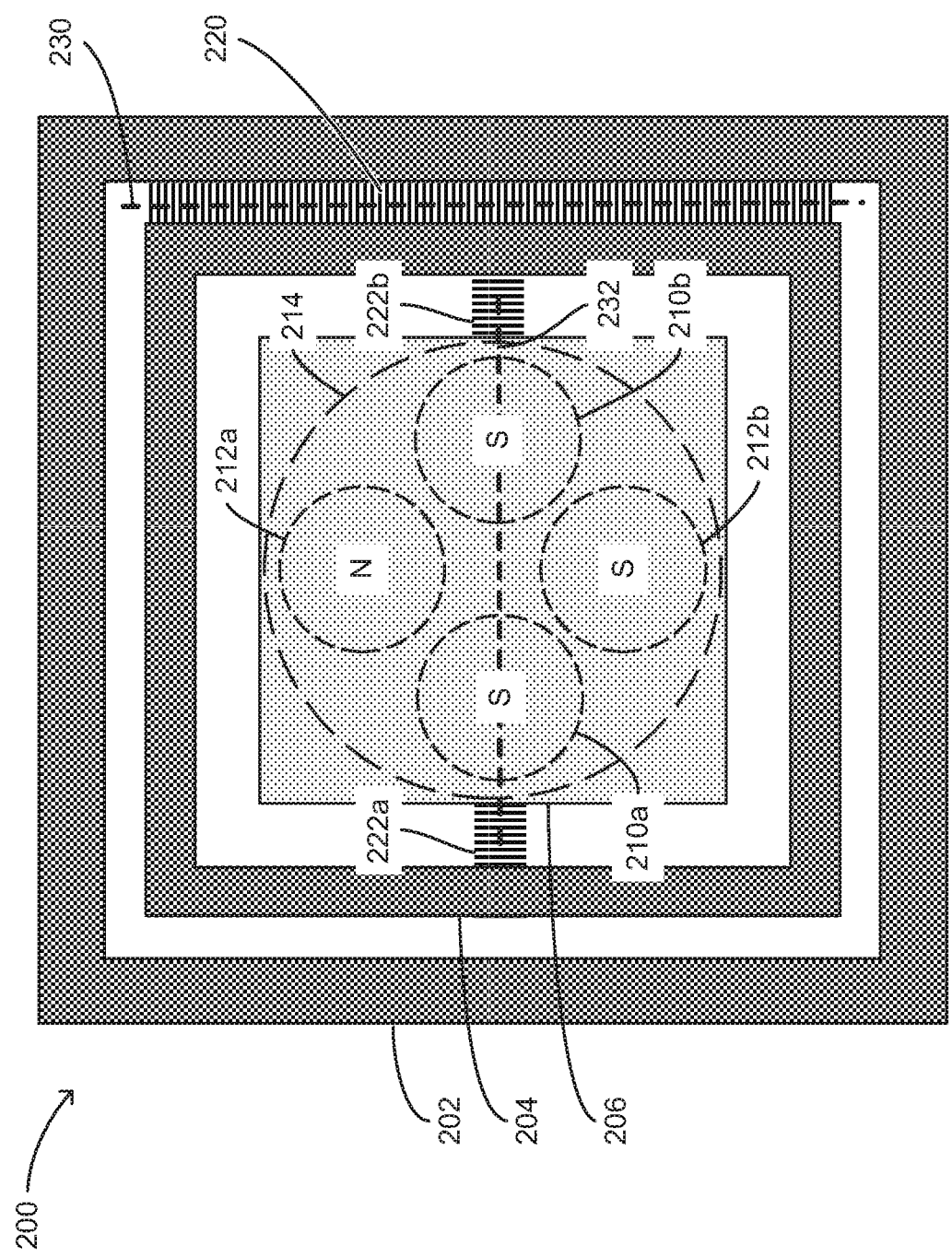
FIG. 2 is a plan view of a second MEMS scanning mirror according to various embodiments of the present disclosure.

FIG. 2 is a plan view of a second MEMS scanning mirror 200 according to various embodiments of the present disclosure. The MEMS scanning mirror 200 includes an outer frame 202, an inner frame 204, and a mirror 206. The inner frame 204 is rotationally coupled to the outer frame 202 by a bending hinge 220, which permits rotational motion of the inner frame 204 relative to the outer frame 202 along an axis of rotation 230. The bending hinge 220 is referred to herein as a "slow-axis hinge" for similar reasons as the term is used with reference to the slow-axis hinges 120a and 120b of FIG. 1. The mirror 206 is rotationally coupled to the inner frame 204 by torsional hinges 222a and 222b, which permit rotational motion of the mirror 206 relative to the inner frame 204 along an axis of rotation 232. The hinges 222a and 222b are referred to herein as "fast-axis hinges," again, for similar reasons as the term is used with reference to the fast-axis hinges 122a and 122b of FIG. 1.

As for the fast-axis and slow-axis hinges 122a, 122b and 120a, 120b of the MEMS scanning mirror 100, the materials and proportions of the slow-axis hinge 220 and the fast-axis hinges 120a and 120b determine the hinges' resonance frequencies, and the slow-axis hinge 220 is designed to have a lower resonance frequency than the fast-axis hinges 222a and 222b. Where a large deflection is required for the slow-axis hinge 220, BoPET or elastomer may be a preferred material than silicon for the slow-axis hinge 220.

Magnets 210a, 210b, 212a, and 212b are mounted to a bottom side of the mirror 206, and an inductor 214 is mounted below the bottom side of the mirror 106. A center of the magnetic field of the inductor 214 intersects the axis of rotation 232. As in the MEMS scanning mirror 100, the magnets 212a and 212b are oriented with opposing magnetic polarity to each other to cause rotation of the mirror 206 about the axis of rotation 232. Unlike the MEMS scanning mirror 100, however, the magnets 210a and 210b are oriented with a common magnetic polarity, to cause rotation of the inner frame 204 and the mirror 206 about the axis of rotation 230. In some embodiments, only a single magnet 210 is provided.

As for the fast-axis and slow-axis hinges 122a, 122b and 120a, 120b of the MEMS scanning mirror 100, the fast-axis hinges 222a and 222b are designed with a resonance frequency approximately twice the resonance frequency of the slow-axis hinge 220, to provide dynamic filtering of an oscillating magnetic field having higher and lower frequency components that correspond to the resonance frequencies of the fast-axis hinges 222a and 222b and the slow-axis hinge 220, respectively. However, as described for the fast-axis and slow-axis hinges 122a, 122b and 120a, 120b of the MEMS scanning mirror 100, ratios that are greater than or less than 2:1 between resonant frequencies for the fast-axis hinges 222a and 222b and the slow-axis hinge 220 may be used in other MEMS scanning mirrors according to the disclosure.

For hinges operating in torsional mode, the resonance frequency is higher, while hinges operating in bending mode may provide a larger scanning field of view. The hybrid hinge system of the MEMS scanning mirror 200 may be designed to provide a two-axis raster scanning pattern with dense scanning patterns over a large field of view.

Figure 3:
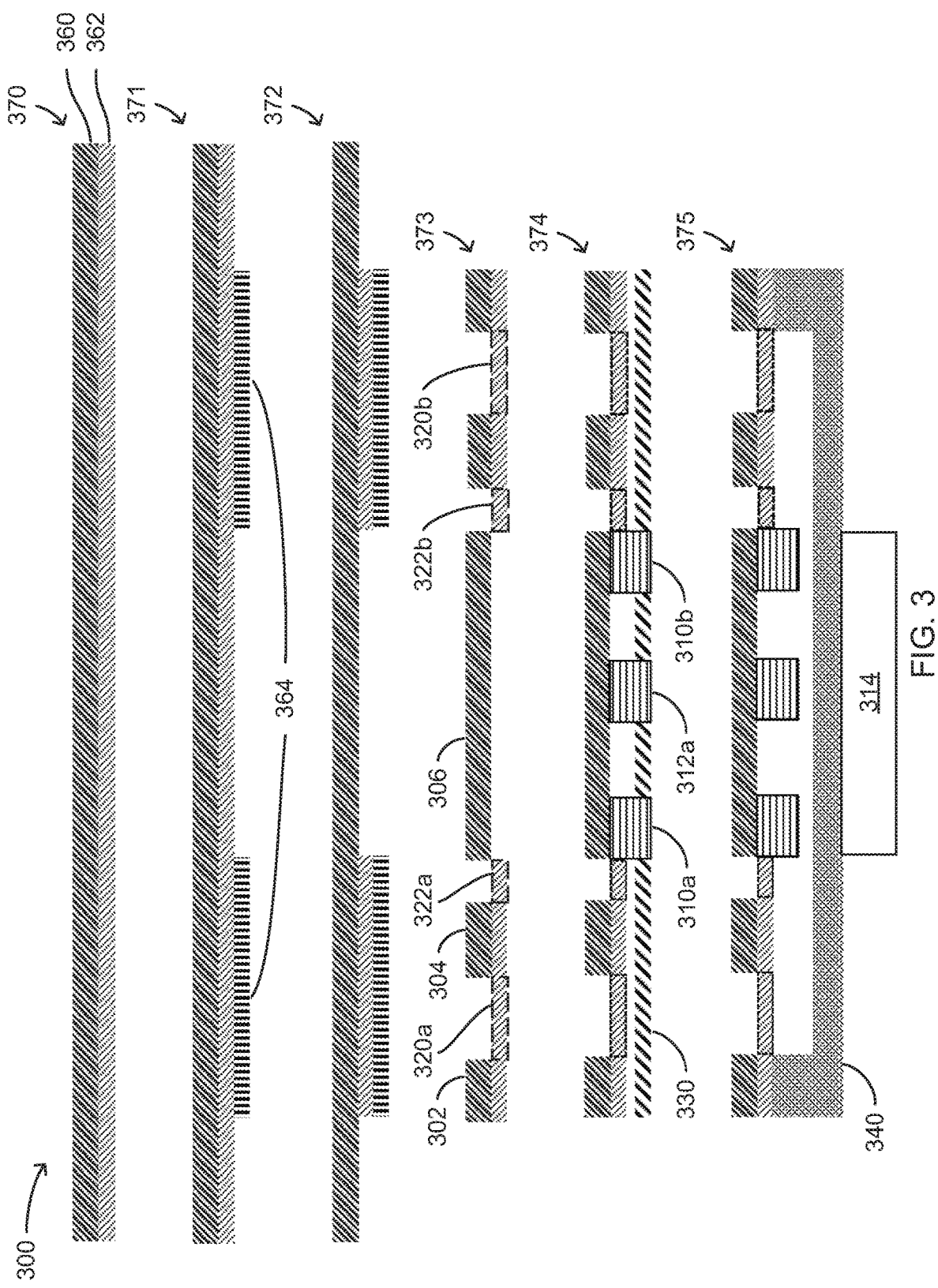
FIG. 3 presents a sequence of steps in a first fabrication process according to various embodiments of the present disclosure.

FIG. 3 presents a sequence of steps in a first fabrication process 300 according to various embodiments of the present disclosure. In step 370, a bottom side of a silicon wafer 360 (also referred to as a "substrate") is bonded to a BoPET film 362 after evaporating chrome onto the BoPET film 362. In step 371, a nickel layer 364 is electroplated onto the BoPET film 362 to serve as a mask for etching. In step 372, the unmasked portions of the BoPET film 362 are etched using a plasma etching technique, such as reactive ion etching with a gas mixture of argon and oxygen. In step 373, the nickel mask is removed from the etched BoPET film 362 and a top side of the silicon wafer 360 is masked with aluminum and etched using plasma etching. It will be understood that in other embodiments, other suitable mask materials and etching techniques may be used to etch the silicon wafer 360.

The etching in step 373 removes a first portion of the silicon wafer 360 to separate an outer frame 302 from an inner frame 304. The etching further removes a second portion of the silicon wafer 360 to separate the inner frame 304 from a mirror plate 306. The remaining portions of the BoPET film 362 span the gap between the outer frame 302 from an inner frame 304 to form slow-axis hinges 320a and 320b and the gap between the inner frame 304 and the mirror plate 306 to form fast-axis hinges 322a and 322b.

Step 373 also includes enhancing the optical reflectivity of the mirror plate 306 by coating with metal or one or more dielectric layers, by physical and/or chemical polishing, or by other suitable technique. In other embodiments, such enhancement may be performed at any stage after the mirror plate 306 is etched in step 373.

Step 374 includes preparing an acrylic template 330 with laser cutting to configure the acrylic template 330 to hold permanent magnets 310a, 310b, 312a, and 312b (magnet 312b is not visible in FIG. 3). The acrylic template 330 is positioned adjacent to the bottom side of the mirror plate 306 to hold the permanent magnets 310a, 310b, 312a, and 312b in desired positions for bonding to the mirror plate 306. In step 375, the acrylic template 330 is removed, an acrylic spacer 340 is bonded to the outer frame 302 and slow-axis hinges 320a and 320b, and an acrylic holder with an embedded inductor 314 are bonded to the acrylic spacer 340 to complete assembly of the MEMS scanning mirror module.

While the fabrication process 300 is described as using certain materials for masks and techniques for etching, it will be understood that in other embodiments other suitable materials and techniques may be used. The inductor 314 is described as embedded in the acrylic spacer 340, however in other embodiments it may be mounted to the acrylic spacer 340 in some other way, or may be mounted to the MEMS scanning mirror module in a step after mounting the acrylic spacer 340. In some embodiments, the acrylic template 330 may be replaced with any positioning structure that is configured to hold permanent magnets in place for bonding while resisting inter-magnet forces of attraction and repulsion attempting to displace the magnets from their intended positions, as well as being suitable for removal without displacing the magnets once they are bonded into position.

The fabrication process 300 has benefits that include improved accuracy in aligning the outer frame 302, the inner frame 304, and the mirror plate 306 with the hinges formed from the BoPET film 362. Furthermore, the use of acrylic template 330 to hold the permanent magnets in desired position while being bonded to the mirror plate 306 reduces magnet positioning errors arising from magnetic forces between the magnets while being positioned. Still further, because the fabrication process 300 uses techniques such as reactive ion etching, the resulting MEMS scanning mirror may be made smaller than devices fabricated using lower-resolution laser cutting and manual fabrication techniques, allowing the use of a single inductor to drive the device, rather than multiple inductors, as well as the fabrication of more compact ultrasound and photoacoustic imaging systems.

Figure 4:
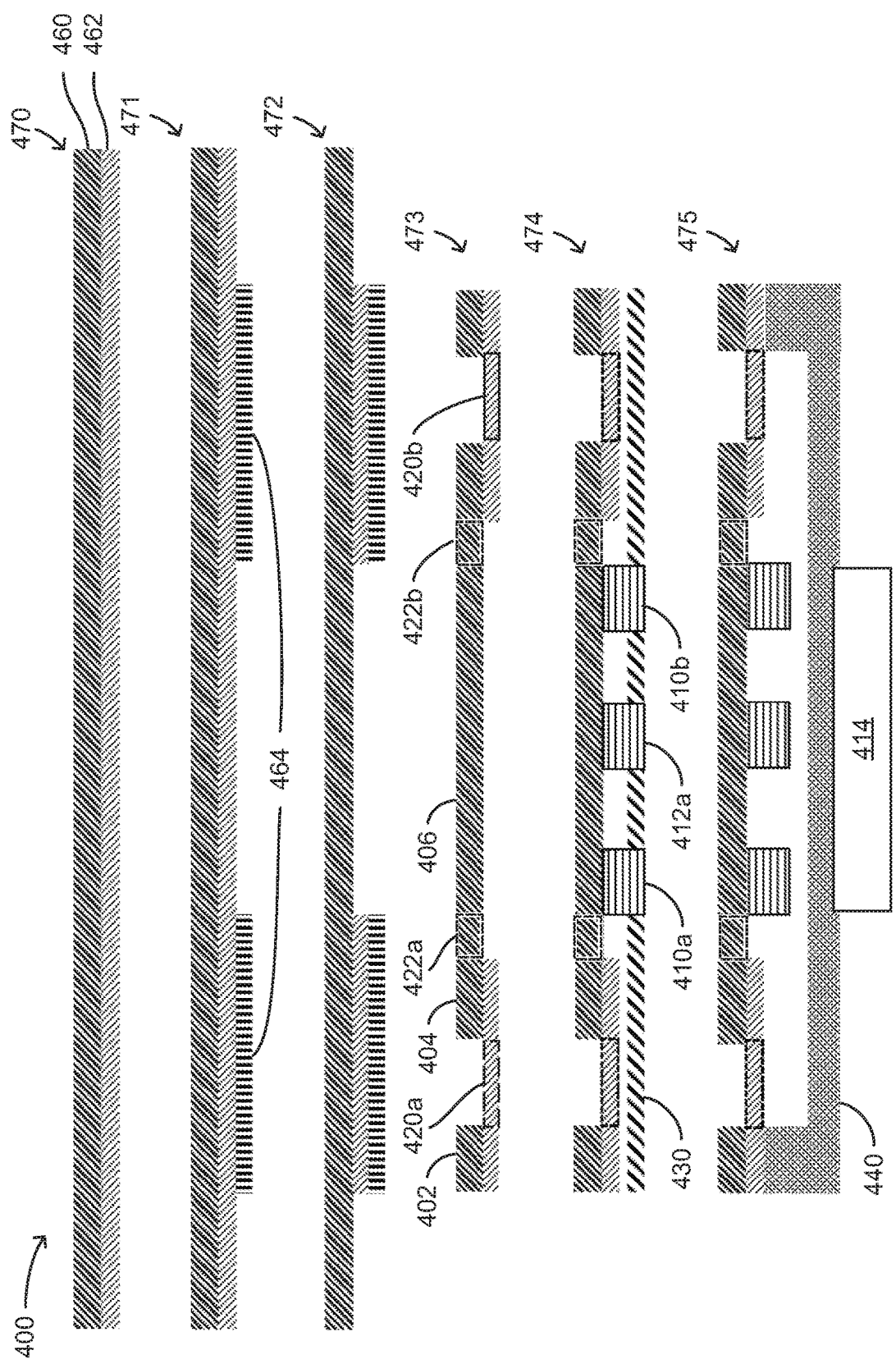
FIG. 4 presents a sequence of steps in a second fabrication process according to various embodiments of the present disclosure.

FIG. 4 presents a sequence of steps in a second fabrication process 400 according to various embodiments of the present disclosure. The fabrication process 400 is similar to the fabrication process 300, however it fabricates a MEMS scanning mirror with silicon fast-axis hinges and BoPET slow-axis hinges.

In step 470, a silicon wafer 460 is bonded to a BoPET film 462 and, in step 471, a mask 464 is deposited onto the BoPET film 462, which is etched in step 472. In step 473, the mask 464 is removed from the etched BoPET film 462 and the silicon wafer 460 is masked with aluminum and etched using plasma etching. The etching of the silicon wafer 460 forms an outer frame 402, an inner frame 404, and a mirror plate 406. As in the fabrication process 300, the outer frame 402 and the inner frame 404 are separated from each other and remain rotationally coupled only by BoPET slow-axis hinges 420a and 420b. The inner frame 404 and the mirror plate 406 are also separated from each other, but remain rotationally coupled by silicon fast-axis hinges 422a and 422b.

In step 474, an acrylic template 430 is used to hold permanent magnets 410a, 410b, 412a, and 412b in position for bonding to the mirror plate 406. Magnet 412b is not visible in FIG. 4. In step 475, the acrylic template 430 is removed, an acrylic spacer 440 with an embedded inductor 414 is bonded to the outer frame 402 and slow-axis hinges 420a and 420b to complete assembly of the MEMS scanning mirror module.

Figure 5A:
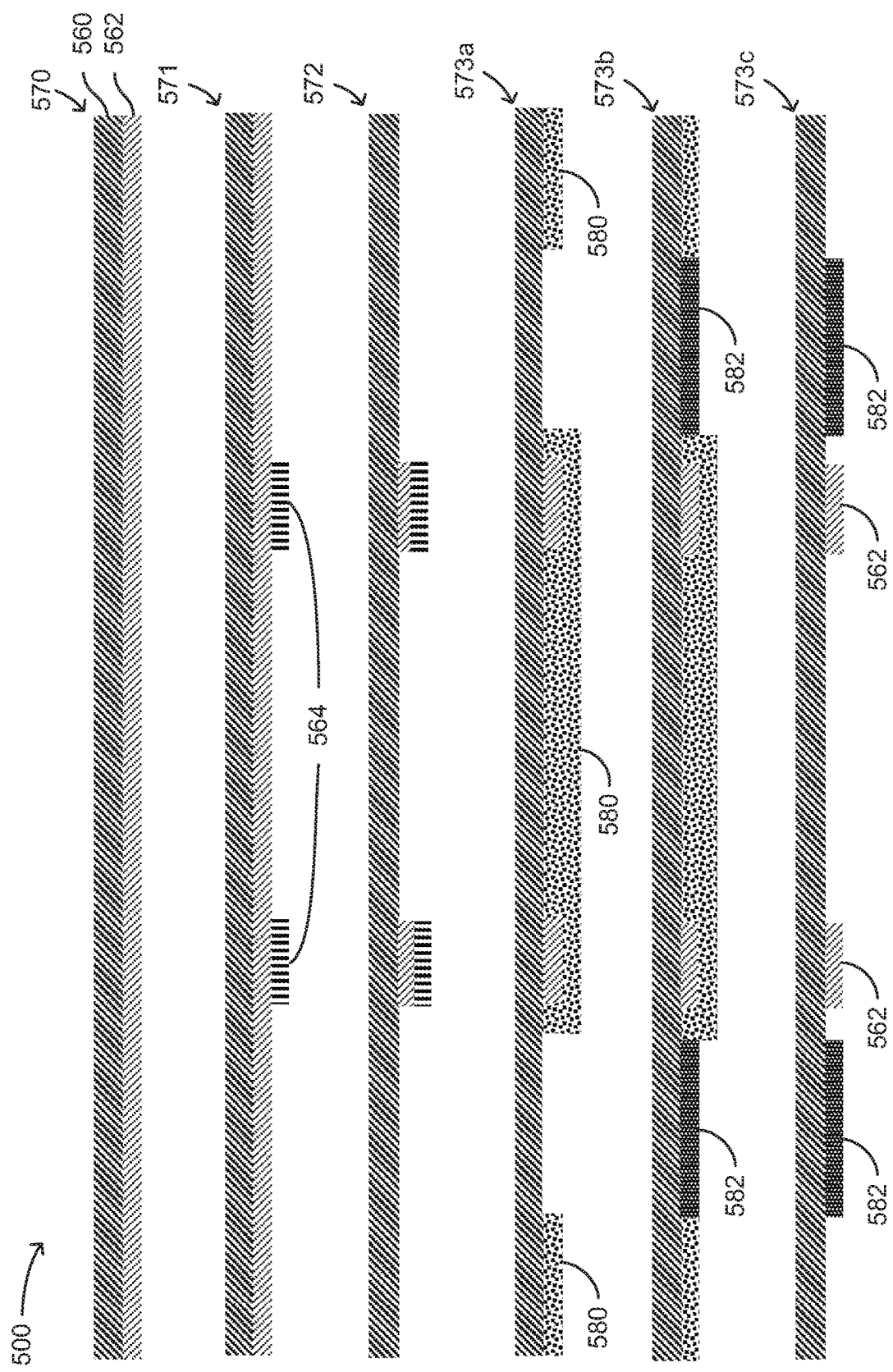
FIGS. 5A and 5B present a sequence of steps in a third fabrication process according to various embodiments of the present disclosure.
Figure 5B:
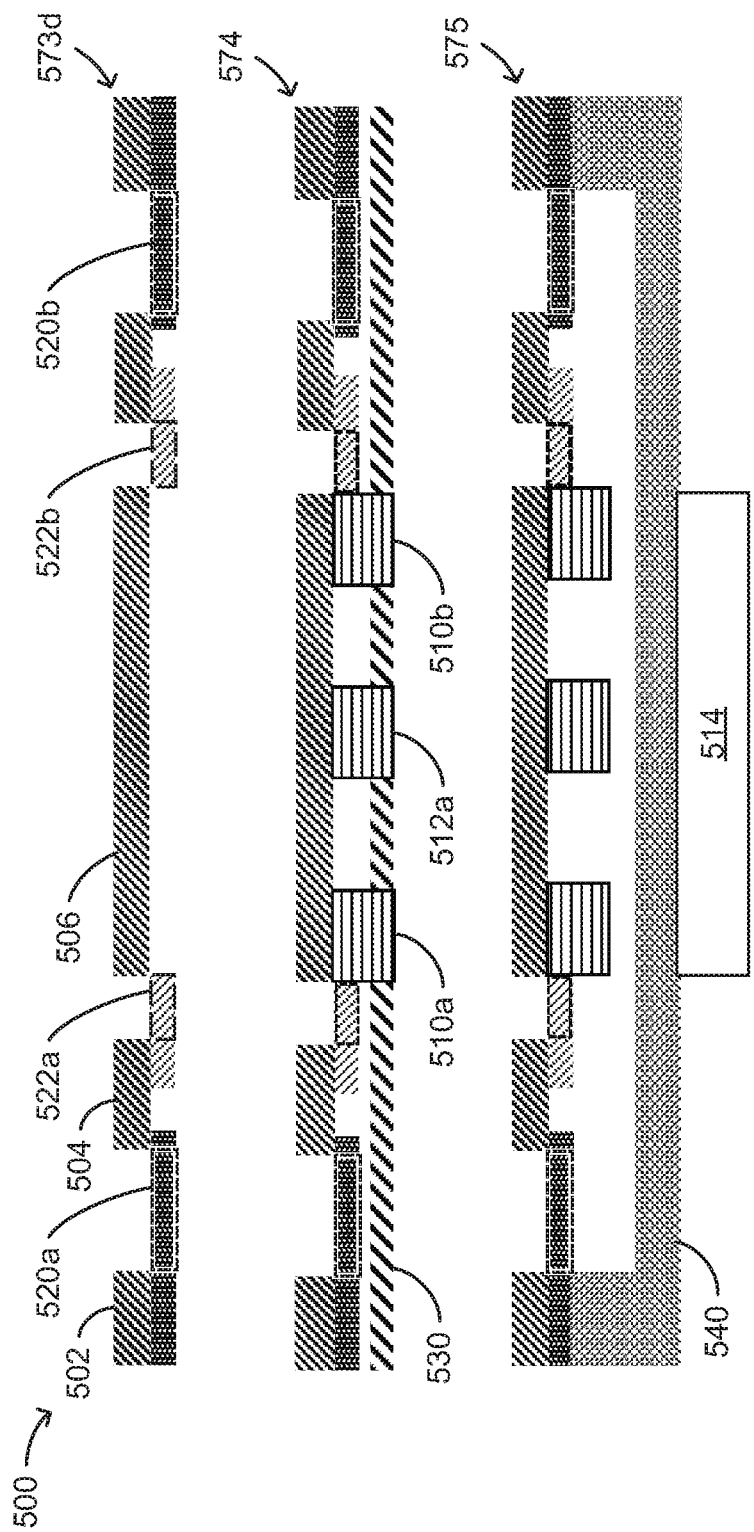

FIGS. 5A and 5B present a sequence of steps in a third fabrication process 500 according to various embodiments of the present disclosure. The fabrication process 500 is again similar to the fabrication processes 300 and 400, however it fabricates a MEMS scanning mirror with BoPET fast-axis hinges and elastomer slow-axis hinges.

In step 570, a silicon wafer 560 is bonded to a BoPET film 562 and, in step 571, a mask 564 is deposited onto the BoPET film 562, which is etched in step 572. In step 573a, the mask 564 is removed and a photoresist mold 580 is formed on the silicon wafer 560, covering the remaining BoPET film 562 and leaving the silicon wafer 560 exposed in cavities into which an elastomer material is cast in step 573b. In step 573c, the photoresist mold 580 is removed, leaving the BoPET 562 and elastomer 582 hinge materials on the bottom of the silicon wafer 560.

In step 573d, the silicon wafer 560 is masked and etched to form an outer frame 502, an inner frame 504, and a mirror plate 506. The outer frame 502 and the inner frame 504 are separated from each other and remain rotationally coupled by elastomer slow-axis hinges 520a and 520b. The inner frame 504 and the mirror plate 506 are also separated from each other and remain rotationally coupled by BoPET fast-axis hinges 522a and 522b.

In step 574, an acrylic template 530 is used to hold permanent magnets 510a, 510b, 512a, and 512b in position for bonding to the mirror plate 506. Magnet 512b is not visible in FIG. 5. In step 575, the acrylic template 530 is removed, an acrylic spacer 540 with an embedded inductor 514 is bonded to the outer frame 502 and slow-axis hinges 520a and 520b to complete assembly of the MEMS scanning mirror module.

Figure 6:
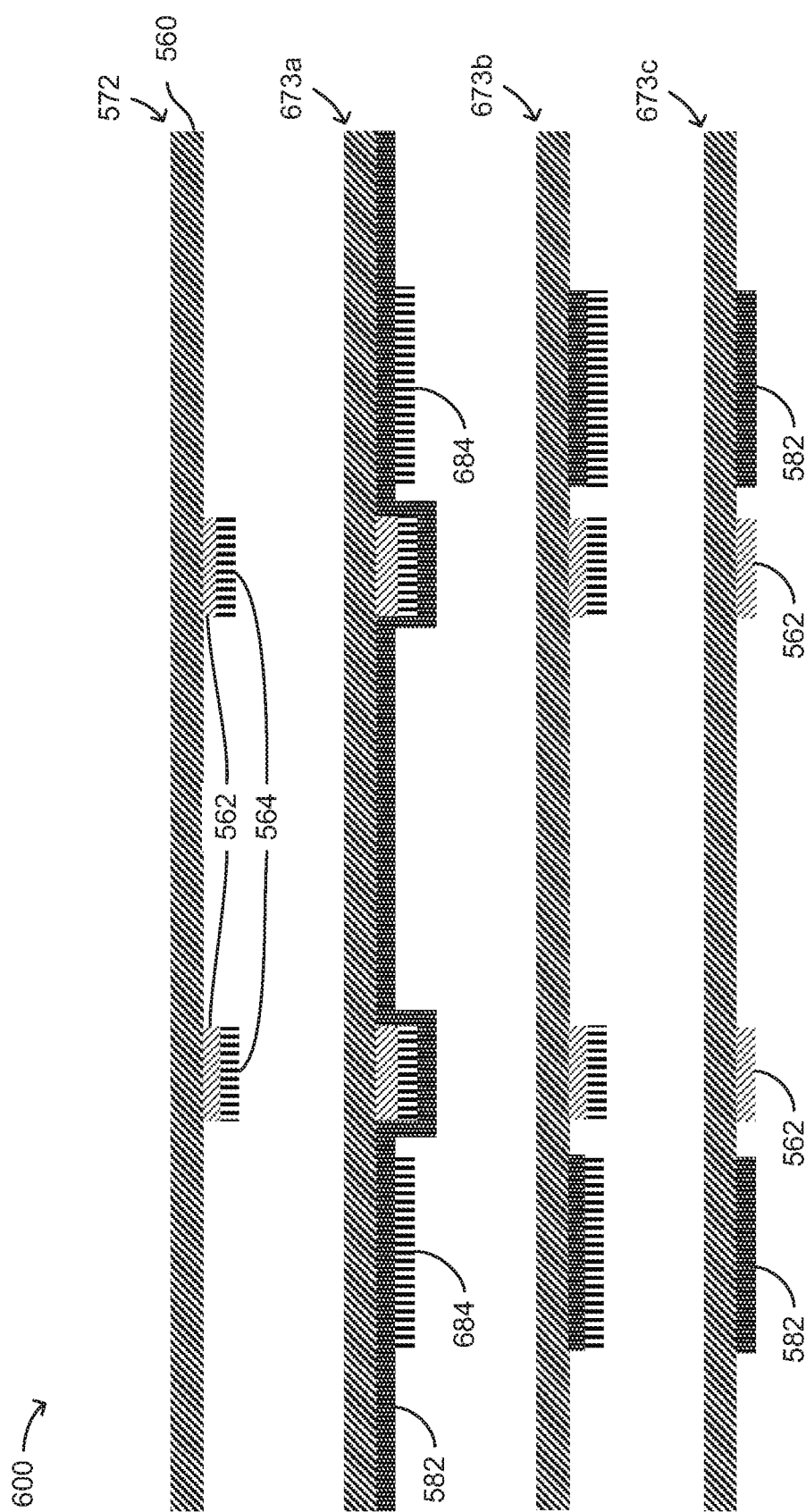
FIG. 6 presents a sequence of steps in a fourth fabrication process according to various embodiments of the present disclosure.

FIG. 6 presents a sequence of steps in a fourth fabrication process 600 according to various embodiments of the present disclosure. The fabrication process 600 includes steps 570 through 572 and steps 573c through 575 of the fabrication process 500. In step 673a, a layer of elastomer 582 is spin-coated or otherwise deposited to cover the bottom of the silicon wafer 560, the remaining BoPET film 562, and the mask 564, and a mask 684 is deposited on the layer of elastomer 582. In step 673b, the exposed elastomer 582 is etched away and, in step 673c, the masks 564 and 684 are removed, leaving the BoPET film 562 and elastomer 582 hinge materials on the bottom of the silicon wafer 560.

As used herein, the term "depositing" may refer to coating, bonding, evaporating, chemical vapor deposition, physical vapor deposition, or other techniques appropriate to the material being deposited. While the present disclosure describes embodiments in which a MEMS scanning mirror is fabricated using a silicon wafer as a substrate, it will be understood that in other embodiments other materials, including single crystalline (such as quartz and other semiconductors), polycrystalline (such as metals, alloys, ceramics), or amorphous materials (such as plastics and polymers), may be used to fabricate a MEMS mirror device according to the disclosure. As used herein, the term "bonding" may refer to attaching with or without an adhesive, spot welding, melting, laminating with or without pressure, or other technique appropriate to the components being mechanically coupled.

While preferred embodiments have been shown and described, modifications thereof can be made by one skilled in the art without departing from the scope or teachings herein. The embodiments described herein are exemplary only and are not limiting. Many variations and modifications of the systems, apparatus, and processes described herein are possible and are within the scope of the disclosure. For example, the relative dimensions of various parts, the materials from which the various parts are made, and other parameters can be varied. Accordingly, the scope of protection is not limited to the embodiments described herein, but is only limited by the claims that follow, the scope of which shall include all equivalents of the subject matter of the claims. Unless expressly stated otherwise, the steps in a method claim may be performed in any order. The recitation of identifiers such as (a), (b), (c) or (1), (2), (3) before steps in a method claim are not intended to and do not specify a particular order to the steps, but rather are used to simplify subsequent reference to such steps.

What is claimed is:

1. A method for manufacturing a Micro-ElectroMechanical Systems (MEMS) scanning mirror, the method comprising:
    depositing a hinge material on a first side of a substrate, wherein the hinge material comprises biaxially-oriented polyethylene terephthalate (BoPET);
    etching the hinge material to form a hinge;
    removing a first portion of the substrate from a second side of the substrate to form an outer frame in the substrate; and
    removing a second portion of the substrate from the second side of the substrate to form an inner frame and a mirror plate in the substrate,
    a first portion of the hinge material rotationally coupling the outer frame to the inner frame for rotation about a first axis of rotation and a second portion of the hinge material rotationally coupling the inner frame to the mirror plate for rotation about a second axis of rotation, the first axis of rotation orthogonal to the second axis of rotation.

2. The method of claim 1, wherein the substrate comprises a silicon wafer.

3. The method of claim 1, wherein:
the first and second portions of the hinge material are configured as torsional hinges, and
the second portion of the hinge material has a resonance frequency twice the resonance frequency of the first portion of the hinge material.

4. The method of claim 1, further comprising:
placing a positioning structure adjacent to a side of the mirror plate corresponding to the first side of the substrate, the positioning structure configured to hold a plurality of permanent magnets in desired positions relative to the mirror plate;
mechanically coupling the plurality of permanent magnets to the side of the mirror plate corresponding to the first side of the substrate; and
removing the positioning structure.

5. The method of claim 4, further comprising:
mechanically coupling an inductor to the outer frame adjacent to the side of the mirror plate corresponding to the first side of the substrate,
the inductor configured to:
cause a first subset of the plurality of permanent magnets to rotate the inner frame and mirror plate relative to the outer frame about the first axis of rotation, and
cause a second subset of the plurality of permanent magnets to rotate the mirror plate relative to the inner frame about the second axis of rotation.

6. The method of claim 5, wherein:
the first subset of the plurality of permanent magnets comprises two permanent magnets positioned symmetrically about the first axis of rotation and oriented with opposing magnetic polarity to each other,
the second subset of the plurality of permanent magnets comprises two permanent magnets positioned symmetrically about the second axis of rotation and oriented with opposing magnetic polarity to each other, and
a center of a magnetic field of the inductor is oriented coaxial with an intersection of the first axis of rotation with the second axis of rotation.

7. A method for manufacturing a Micro-ElectroMechanical Systems (MEMS) scanning mirror, the method comprising:
depositing a hinge material on a first side of a substrate;
removing a first portion of the substrate from a second side of the substrate to form an outer frame in the substrate; and
removing a second portion of the substrate from the second side of the substrate to form an inner frame and a mirror plate in the substrate,
a portion of the hinge material rotationally coupling the outer frame to the inner frame for rotation about a first axis of rotation and a third portion of the substrate rotationally coupling the inner frame to the mirror plate for rotation about a second axis of rotation, the first axis of rotation orthogonal to the second axis of rotation.

8. The method of claim 7, wherein the hinge material comprises biaxially-oriented polyethylene terephthalate (BoPET).

9. The method of claim 8, wherein the substrate comprises a silicon wafer.

10. The method of claim 7, wherein:
the portion of the hinge material is configured as a bending hinge,
the third portion of the substrate is configured as a torsional hinge, and
the third portion of the substrate has a resonance frequency twice the resonance frequency of the portion of the hinge material.

11. The method of claim 7, further comprising:
placing a positioning structure adjacent to a side of the mirror plate corresponding to the first side of the substrate, the positioning structure configured to hold a plurality of permanent magnets in desired positions relative to the mirror plate;
mechanically coupling the plurality of mirrors to the side of the mirror plate corresponding to the first side of the substrate; and
removing the positioning structure.

12. The method of claim 11, further comprising:
mechanically coupling an inductor to the outer frame adjacent to the side of the mirror plate corresponding to the first side of the substrate,
the inductor configured to:
cause a first subset of the plurality of permanent magnets to rotate the inner frame and mirror plate relative to the outer frame about the first axis of rotation, and
cause a second subset of the plurality of permanent magnets to rotate the mirror plate relative to the inner frame about the second axis of rotation.

13. The method of claim 12, wherein:
the first subset of the plurality of permanent magnets comprises one or more permanent magnets positioned on the second axis of rotation and oriented with a common magnetic polarity to each other,
the second subset of the plurality of permanent magnets comprises two permanent magnets positioned symmetrically about the second axis of rotation and oriented with opposing magnetic polarity to each other, and
a center of a magnetic field of the inductor intersects the second axis of rotation.

14. A method for manufacturing a Micro-ElectroMechanical Systems (MEMS) scanning mirror, the method comprising:
depositing a hinge material on a first side of a substrate, wherein the hinge material covers less than all of the first side of the substrate;
depositing an elastomer material separate from the hinge material on the first side of the substrate;
removing a first portion of the substrate from a second side of the substrate to form an outer frame in the substrate; and
removing a second portion of the substrate from the second side of the substrate to form an inner frame and a mirror plate in the substrate,
etching the deposited elastomer material to form a hinge, whereby a portion of the elastomer material is configured as a bending hinge rotationally coupling the outer frame to the inner frame for rotation about a first axis of rotation,
a portion of the hinge material is configured as a torsional hinge rotationally coupling the inner frame to the mirror plate for rotation about a second axis of rotation, the first axis of rotation orthogonal to the second axis of rotation.

15. The method of claim 14, wherein the hinge material comprises biaxially-oriented polyethylene terephthalate (BoPET).

16. The method of claim 14, further comprising:
placing a positioning structure adjacent to a side of the mirror plate corresponding to the first side of the substrate, the positioning structure configured to hold a plurality of permanent magnets in desired positions relative to the mirror plate;

mechanically coupling the plurality of mirrors to the side of the mirror plate corresponding to the first side of the substrate; and removing the positioning structure.

17. The method of claim 16, further comprising:

mechanically coupling an inductor to the outer frame adjacent to the side of the mirror plate corresponding to the first side of the substrate, the inductor configured to:
- cause a first subset of the plurality of permanent magnets to rotate the inner frame and mirror plate relative to the outer frame about the first axis of rotation, and
- cause a second subset of the plurality of permanent magnets to rotate the mirror plate relative to the inner frame about the second axis of rotation.

18. The method of claim 17, wherein:

the first subset of the plurality of permanent magnets comprises one or more permanent magnets positioned on the second axis of rotation and oriented with a common magnetic polarity to each other, the second subset of the plurality of permanent magnets comprises two permanent magnets positioned symmetrically about the second axis of rotation and oriented with opposing magnetic polarity to each other, and a center of a magnetic field of the inductor intersects the second axis of rotation.

* * * * *